United States Patent
Tsorng et al.

(10) Patent No.: US 11,147,183 B2
(45) Date of Patent: Oct. 12, 2021

(54) FLEXIBLE LEVER OF EXTERNAL MODULE AT SERVER

(71) Applicant: Quanta Computer Inc., Taoyuan (TW)

(72) Inventors: Yaw-Tzorng Tsorng, Taoyuan (TW); Nan-Chun Wu, Taoyuan (TW); Chun Chang, Taoyuan (TW); Ming-Lung Wang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/786,117

(22) Filed: Feb. 10, 2020

(65) Prior Publication Data

US 2021/0251099 A1    Aug. 12, 2021

(51) Int. Cl.

| H05K 7/14 | (2006.01) |
|---|---|
| H05K 7/02 | (2006.01) |
| H05K 5/02 | (2006.01) |
| H05K 5/00 | (2006.01) |

(52) U.S. Cl.
CPC ......... H05K 7/1489 (2013.01); H05K 5/0221 (2013.01); H05K 7/023 (2013.01); H05K 7/1409 (2013.01); H05K 7/1417 (2013.01); H05K 5/0021 (2013.01); H05K 7/1401 (2013.01)

(58) Field of Classification Search
CPC .. H05K 7/1409; H05K 7/1489; H05K 7/1417; H05K 5/0021; H05K 7/023; H05K 7/1401; H05K 7/1411; G06F 1/186
See application file for complete search history.

(56) References Cited

U.S. PATENT DOCUMENTS

| 8,936,477 B1 * | 1/2015 | Kerrigan | ............... H01R 43/26 |
|---|---|---|---|
| | | | 439/157 |
| 9,107,321 B2 * | 8/2015 | Yin | ..................... H05K 7/1489 |
| 9,295,178 B1 * | 3/2016 | Aldea | ..................... F16B 2/185 |
| 10,607,658 B1 * | 3/2020 | Qian | ..................... H05K 7/1489 |
| 10,686,268 B2 * | 6/2020 | Wang | .................. H05K 7/1411 |

* cited by examiner

*Primary Examiner* — James Wu
(74) *Attorney, Agent, or Firm* — Nixon Peabody LLP

(57) ABSTRACT

A lever assembly for coupling a computer module to a chassis includes a base lever, a locking tab, and a flexible element positioned between the base lever and the locking tab. The base lever is rotatably coupled to the computer module. The base lever is rotatable between an installed position and an opened position. The locking tab is rotatably coupled to the computer module for engaging a locking surface on the chassis when in a locked position. The locking tab is rotatable between the locked position and an unlocked position. The flexible element is configured to bias the locking tab into the locked position when the base lever is in the installed position. Rotation of the base lever to the opened position induces rotation of the locking tab to the unlocked position.

20 Claims, 7 Drawing Sheets

FLEXIBLE LEVER OF EXTERNAL MODULE AT SERVER

TECHNICAL FIELD

The disclosure relates to computer server hardware generally, and more specifically, to a lever assembly for retaining a computer system module in a server housing.

BACKGROUND

Computing devices, especially in datacenters, can make use of multiple modules designed to be easily installed, removed, and/or replaced. Generally, a module can be inserted into a chassis such that connectors at a distal end of the module engage corresponding connectors within the chassis, such as connectors of a midplane board. In some cases, a single chassis can include a midplane board with connectors for multiple modules, including connectors for modules on either planar side of the midplane board, such as front modules and rear modules.

Modules can be retained in place with a mechanical retention device, such as a clip. If the location of the connectors in the chassis (e.g., connectors on a midplane board) are not in an expected position, and/or if the module being inserted is not exactly the right depth, the module may not properly clip in place. In some cases, manufacturing and/or assembly tolerances can cause some boards, such as midplane boards, to deflect, thus altering the actual location of the connectors on the midplane board within the chassis. In such cases, a module (e.g., rear module) may not be able to be properly installed and/or secured in place. The present disclosure is directed at solving these problems.

SUMMARY

Aspects of the present disclosure include a lever assembly for coupling a computer module to a chassis. The lever assembly includes a base lever, a locking tab, and a flexible element. The base lever is rotatably coupled to a computer module. The base lever is rotatable between an installed position and an opened position. The locking tab is coupled to the base lever. The locking tab is rotatably coupled to the computer module for engaging a locking surface on a chassis when in a locked position. The locking tab is rotatable between the locked position and an unlocked position. The flexible element is coupled to the base lever. The flexible element is positioned between the base lever and the locking tab to bias the locking tab into the locked position, when the base lever is in the installed position. Rotation of the base lever to the opened position induces rotation of the locking tab to the unlocked position.

In some examples, the base lever is rotatable about an axis of rotation. The locking tab is rotatable about the axis of rotation. In some examples, the base lever includes an expulsion tab for pushing against the chassis when the base lever is rotated to the opened position, while the computer module is within the chassis.

In some examples, the lever assembly further includes a lever biasing element, and a lever locking element. The lever biasing element is configured to bias the base lever to the opened position. The lever locking element is coupled to the computer module. The lever locking element is configured to engage with the computer module to retain the base lever in the installed position. The lever locking element is actuatable to release the base lever. The lever locking element permits the lever biasing element to rotate the base lever into the opened position.

In some examples, the base lever further includes a pin moveable between two ends of a channel on the computer module. The pin stops rotation of the base lever at the opened position.

In some examples, the chassis is a computer server chassis having a midplane. The midplane is couplable to a front module on a first side of the midplane. The midplane is couplable to a rear module on a second side of the midplane opposite the first side of the midplane. The computer module is the rear module. The rear module is couplable to the midplane, when the rear module is inserted into the chassis, and the locking tab is moved into the locked position. The flexible element flexes to account for deformation in the midplane. In some examples, the flexible element includes a spring coupled to the base lever.

Additional aspects of the present disclosure include a computer module for insertion within a chassis. The computer module includes a module frame, and a lever assembly coupled to the module frame. The module frame is insertable into a chassis. The lever assembly includes a base lever, a locking tab, and a flexible element. The base lever is rotatably coupled to the module frame. The base lever is rotatable between an installed position, and an opened position. The locking tab is coupled to the base lever. The locking tab is rotatably coupled to the module frame for engaging a locking surface on the chassis, when in a locked position. The locking tab is rotatable between the locked position and an unlocked position. The flexible element is coupled to the base lever. The flexible element is positioned between the base lever and the locking tab to bias the locking tab into the locked position, when the base lever is in the installed position. Rotation of the base lever to the opened position induces rotation of the locking tab to the unlocked position.

In some examples, the base lever is rotatable about an axis of rotation, and the locking tab is rotatable about the axis of rotation. In some examples, the base lever includes an expulsion tab for pushing against the chassis when the base lever is rotated to the opened position, while the module frame is inserted within the chassis.

In some examples, the lever assembly further includes a lever biasing element and a lever locking element. The lever biasing element is configured to bias the base lever to the opened position. The lever locking element is coupled to the computer module, and is engageable with the computer module to retain the base lever in the installed position. The lever locking element is actuatable to release the base lever, and to permit the lever biasing element to rotate the base lever into the opened position.

In some examples, the base lever further includes a pin moveable between two ends of a channel on the computer module. The pin stops rotation of the base lever at the opened position.

In some examples, the chassis is a computer server chassis having a midplane. The midplane is couplable to a front module on a first side of the midplane. The midplane is also couplable to a rear module on a second side of the midplane. The second side of the midplane is opposite from the first side of the midplane. In some such examples, the computer module is the rear module. The computer module is couplable to the midplane, when the computer module is inserted into the chassis and the locking tab is moved into the locked position. Further, the flexible element flexes to account for deformation in the midplane. In some examples, the flexible element includes a spring coupled to the base lever.

Further aspects of the present disclosure include a method where a computer module is inserted into a chassis. The computer module includes a lever assembly for securing the computer module into the chassis. The computer module is secured in the chassis in an installed position. A locking tab of the lever assembly is configured to engage against a locking surface of the chassis. Deformation of a midplane is accommodated by compressing a flexible element coupled to the base lever. The flexible element is positioned between the locking tab, and a base lever. Releasing the computer module includes rotating the base lever to an opened position, to induce rotation of the locking tab to an unlocked position.

In some examples, the base lever is rotatable about an axis of rotation, and the locking tab is rotatable about the axis of rotation. In some examples, the base lever includes an expulsion tab. The releasing the computer module further includes applying force to the chassis, using the expulsion tab, in response to rotating the base lever to the opened position.

In some examples, the lever assembly further includes a lever biasing element and a lever locking element. The lever biasing element is configured to bias the base lever to the opened position. The lever locking element is coupled to the computer module, and is engageable with the computer module to retain the base lever in an installed position. The releasing the computer module further includes actuating the lever locking element to release the base lever, and to permit the lever biasing element to rotate the base lever into the opened position.

In some examples, the base lever further includes a pin moveable between two ends of a channel on the computer module. The pin stops rotation of the base lever at the opened position. In some examples, the flexible element includes a spring coupled to the base lever.

The above summary is not intended to represent each implementation or every aspect of the present disclosure. Rather, the foregoing summary merely provides examples of some of the novel aspects and features set forth herein. The above features and advantages, and other features and advantages of the present disclosure, will be readily apparent from the following detailed description of representative implementations and modes for carrying out the present disclosure, when taken in connection with the accompanying drawings and the appended claims.

BRIEF DESCRIPTION OF THE DRAWINGS

The foregoing and other advantages of the present disclosure will become apparent upon reading the following detailed description and upon reference to the drawings.

Figure 1:
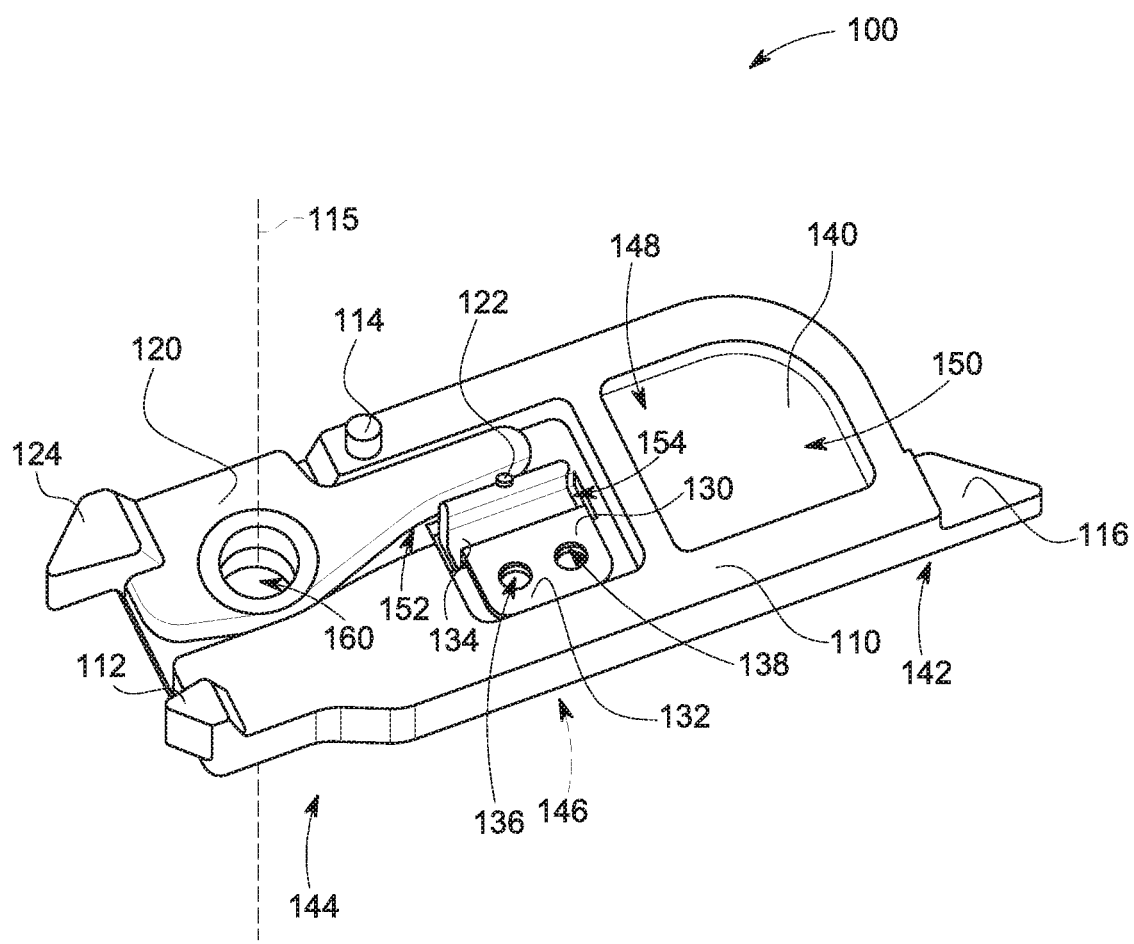
FIG. 1 is a top axonometric view of a lever assembly, according to some implementations of the present disclosure.

While the present disclosure is susceptible to various modifications and alternative forms, specific implementations have been shown by way of example in the drawings and will be described in further detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

The present disclosure is described with reference to the attached figures, where like reference numerals are used throughout the figures to designate similar or equivalent elements. The figures are not drawn to scale, and are provided merely to illustrate the instant disclosure. Several aspects of the disclosure are described below with reference to example applications for illustration.

Several definitions that apply throughout this disclosure will now be presented. The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series, and the like.

A chassis can include openings to accept one or more modules (e.g., computer modules). Each module can be an interchangeable part that is easily installed, removed, and/or replaced. Thus, a datacenter having many chassis can be easily set up and serviced with minimal downtime. Each module can be inserted into an opening or a receptacle of the chassis. Insertion of a module is designed to permit connectors of the module (e.g., motherboard connectors) to engage corresponding connectors within the chassis (e.g., connectors on a midplane board). In some implementations, modules can be secured in place, such as with a mechanical retention device, such as a clip.

In some implementations, a chassis can accept a front module and a rear module, from respective front sides and rear sides of the chassis. When installed, the front module and the rear module can be coupled to opposite sides of a midplane board. Sometimes, midplane boards can flex and/ or deform for a number of reasons, such as manufacturing tolerances, or assembly tolerances. When flexed and/or deformed, a midplane board can inhibit the full insertion of a module into the chassis. While such a module may be able to make electrical connection with the midplane board, that module may be unable to secure in place with its mechanical retention device.

As disclosed herein, a mechanical retention device can make use of a locking tab coupled to a lever base (e.g., a base lever) and a flexible element. Thus, despite minor misalignment of a module within the chassis (e.g., due to flexing and/or deformation of the midplane board), the flexible element can flex to account for this minor misalignment, and ensure the module is able to be fully secured in the chassis.

In some implementations, a front module can be a storage device, such as a hard drive. In some implementations, a rear module can be a motherboard with a central processing unit (CPU). In some implementations, the rear module can operate as a computer server. In some implementations, insertion of both a front module and a rear module into a chassis can result in coupling the electronic components of the front module to electronic components of the rear module (e.g., through the midplane board).

While some of the implementations illustrated herein relate to rear modules insertable into a computer chassis, the present disclosure relates to any suitable module (e.g., front, rear, top, bottom, side, etc.) insertable into any suitable chassis. Further, while various implementations are disclosed herein depicting a lever assembly installed in a bottom of a computer module, and designed to engage a chassis into which the computer module is inserted, a lever assembly according to the present disclosure can be otherwise installed in other locations of a computer module, and/or may be installed in a chassis to engage with inserted computer modules.

Figure 2:
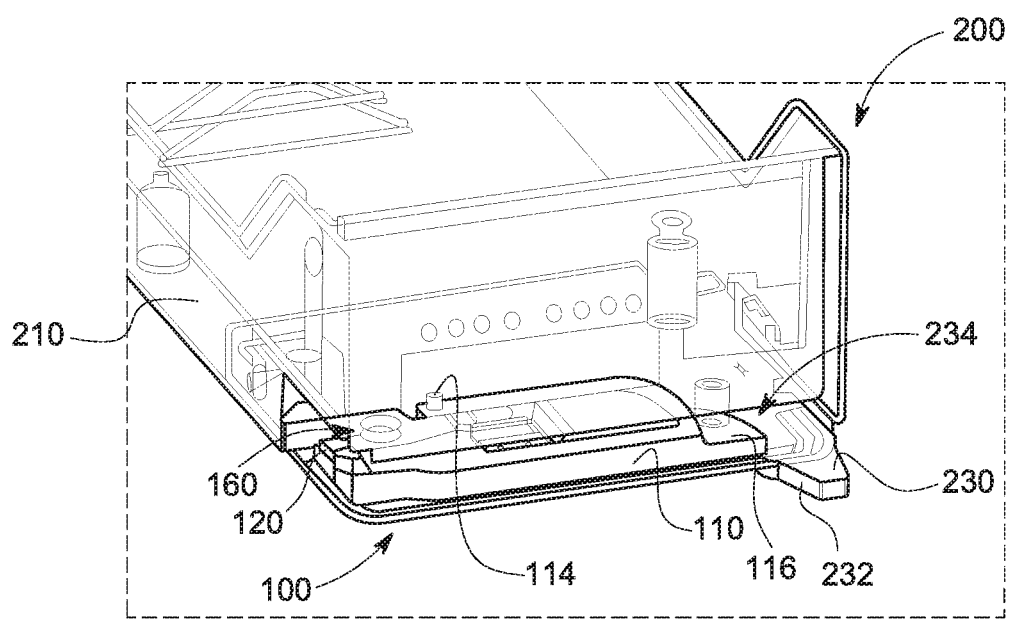
FIG. 2 is a rear axonometric view of a computer module comprising the lever assembly of FIG. 1 in an installed position, according to some implementations of the present disclosure.
Figure 3:
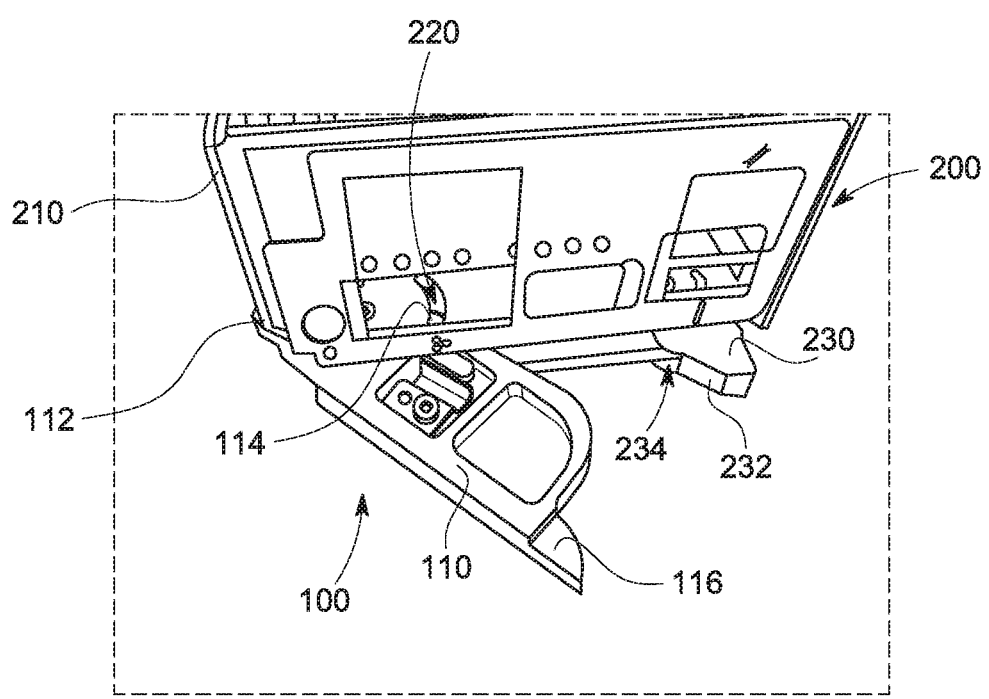
FIG. 3 is a rear axonometric view of the computer module of FIG. 2 with the lever assembly in an opened position, according to some implementations of the present disclosure.
Figure 4:
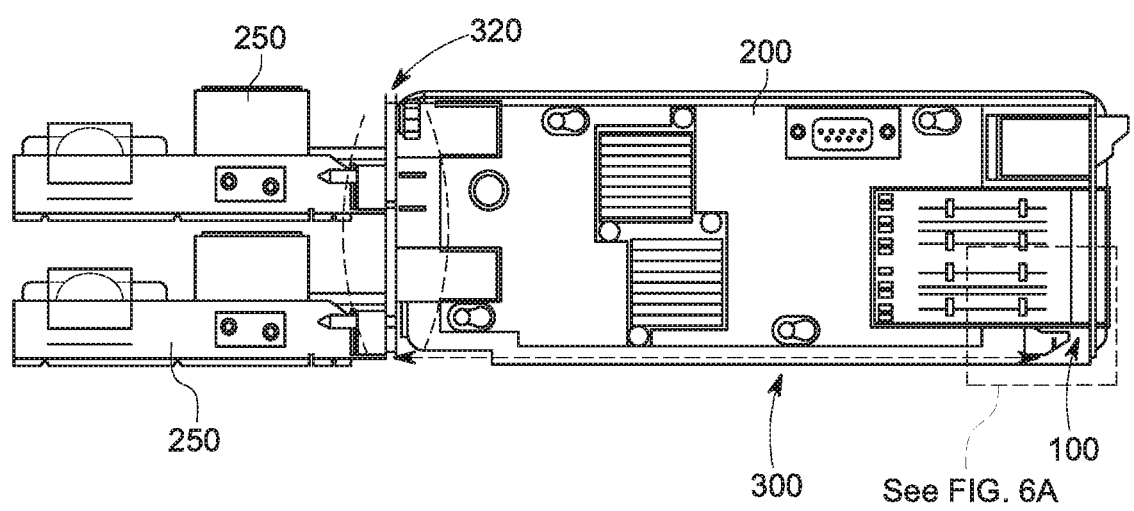
FIG. 4 is a top view of a computer chassis comprising two front modules and a rear module, according to some implementations of the present disclosure.

Referring generally to FIGS. 1-4, a computer module 200 includes a lever assembly 100 for coupling the computer module 200 to a chassis 300 (e.g., a server chassis) (FIG. 4). The lever assembly 100 includes a base lever 110, a locking tab 120, and a flexible element 130 (FIG. 1). The base lever 110 is rotatable between an installed position (FIG. 2) and an opened position (FIG. 3). The locking tab 120 is rotatable between a locked position (FIG. 2) and an unlocked position (FIG. 3). Rotation of the base lever 110 to the opened position induces rotation of the locking tab 120 to the unlocked position (FIG. 3).

FIG. 1 is a top axonometric view of a lever assembly 100, according to some implementations of the present disclosure. The lever assembly 100 includes the base lever 110, the locking tab 120, and the flexible element 130. The base lever 110 can include a closure tab 116, an expulsion tab 112, and a pin 114. The locking tab 120 can include an arm 122, and an angled stop tab 124. The flexible element can include a rigid portion 132 and an elastic portion 134.

The base lever 110 includes a main body 140 having an end 142 supporting closure tab 116, and an opposite end 144 supporting the expulsion tab 112. The main body 140 has a lower surface 146 for contacting with a bottom of the module 200 (in FIG. 2). The main body 140 has an opposite upper surface 148, defining a first depression 150 near the end 142. A second depression 152 is formed on the upper surface 148, and holds the flexible element 130 and the locking tab 120.

A slot 154 is formed in the second depression 152 to accommodate the elastic portion 134 of the flexible element 130. Thus, the arm 122 of the locking tab 120 can compress the elastic portion 134 of the flexible element 130 in the slot 154. The pin 114 of the base lever 110 extends on one side of the upper surface 148 in proximity to the arm 122 of the locking tab 120.

The base lever 110 is rotatable about an axis of rotation 115 that passes through an opening 160 of the base lever 110. The locking tab 120 is coupled to the base lever 110, but free to rotate independently of the base lever (e.g., about the axis of rotation 115). As depicted in FIG. 1, the locking tab 120 is rotatable about the same axis of rotation 115 as the base lever 110. In some other implementations, the locking tab 120 is rotatable about a different axis of rotation from the base lever 110.

The flexible element 130 is coupled to the base lever 110. In some implementations, the flexible element 130 is positioned between the base lever 110 and the locking tab 120. In some implementations, the flexible element 130 is coupled to the base lever 110, such as being fixed to the base lever 110 via one or more screws. In this example, the rigid portion 132 of the flexible element 130 has two mounting holes 136 and 138 that accommodate fasteners, such as screws, to secure the flexible element 130 to corresponding holes in the second depression 152 of the base lever 110.

The flexible element 130 is configured to bias the locking tab 120 via an arm 114 of the locking tab 120. In turn, the flexible element 130 is configured to bias the locking tab 120 into the locked position with respect to the chassis 300 (FIG. 4), when the base lever 110 is in the installed position with respect to the computer module 200.

As depicted in FIG. 1, the flexible element 130 can include a rigid portion 132 that can be removably or permanently affixed to the base lever 110. The flexible element 130 can also include an elastic portion 134 that is configured to bias the arm 122 of the locking tab 120, as described herein. In this example, the elastic portion 134 is a "U" shape having two opposite sides, one of which is in contact with the arm 122. In some implementations, the flexible element 130 includes a spring coupled to the base lever 110. However, the flexible element 130 can be implemented in any other suitable way, provided that the flexible element 130 is able to account for slight rotation of the locking tab 120 with respect to the base lever 110.

While the lever assembly 100 is depicted as including all of the components described herein with respect to FIG. 1, more or fewer components can be included in a lever assembly for securing a computer module to a chassis. For example, in some implementations, a first alternative lever assembly includes the base lever 110, the locking tab 120, a spring, and a locking element (e.g., the closure tab 116). In another example, in some implementations, a second alternative lever assembly includes the base lever 110, the locking tab 120, the flexible element 130, and the angled stop tab 124. Thus, various lever assemblies for securing a computer module to a chassis can be formed using any portion or portions of the components shown and described herein and/or in combination with one or more other components.

FIG. 2 is a rear axonometric view of the computer module 200 that includes the lever assembly 100 of FIG. 1 in the installed position, according to some implementations of the present disclosure. The computer module 200 includes the lever assembly 100, and a module frame 210. The computer module 200 can include a curved channel 220, and a lever locking feature 230. The base lever 110 of the lever assembly 100 is rotatably coupled to the module frame 210 of the computer module 200, via the opening 160 of the base lever 110. The locking tab 120 of the lever assembly 100 is coupled to the base lever 110, and rotatably coupled to the module frame 210 of the computer module 200 via the same opening 160.

In some implementations, the curved channel 220 is formed on a portion of the module frame 210. The pin 114 of the base lever 110 protrudes from a main body of the base lever 110. A portion of the pin 114 is moveable within the curved channel 220 of the computer module 200. The range of movement of the pin 114 is limited by the ends of the curved channel 220.

The locking feature 230 of the computer module 200 can include an actuation tab 232 and a lever receiving slot 234. The closure tab 116 of the base lever 110 is configured to fit within the lever receiving slot 234 of the lever locking feature 230 of the computer module 200. In some implementations, at least a portion of the closure tab 116 is housed within the computer module 200 (e.g., within the lever receiving slot 234 of the lever locking feature 230) in the installed position, thus locking the lever assembly 100 in place with respect to the computer module 200. In some implementations, the closure tab 116 of the base lever 110 acts like a locking element, and is engageable with the computer module 200 to retain the base lever 110 in the installed position.

Referring now to FIG. 3, a rear axonometric view of the computer module 200 of FIG. 2 is depicted in the opened position, according to some implementations of the present disclosure. As depicted in FIG. 3, the closure tab 116 of the base lever 110 is actuatable to release the base lever 110 from the lever locking feature 230 of the computer module 200, thereby permitting the base lever 110 to rotate into the opened position. When the computer module 200 is installed in a chassis, rotation of the base lever 110 into the opened position can cause the expulsion tab 112 of the base lever 110 to press against an adjacent portion of the chassis, thereby causing the computer module 200 to be at least partially removed from the chassis.

Figure 6A:
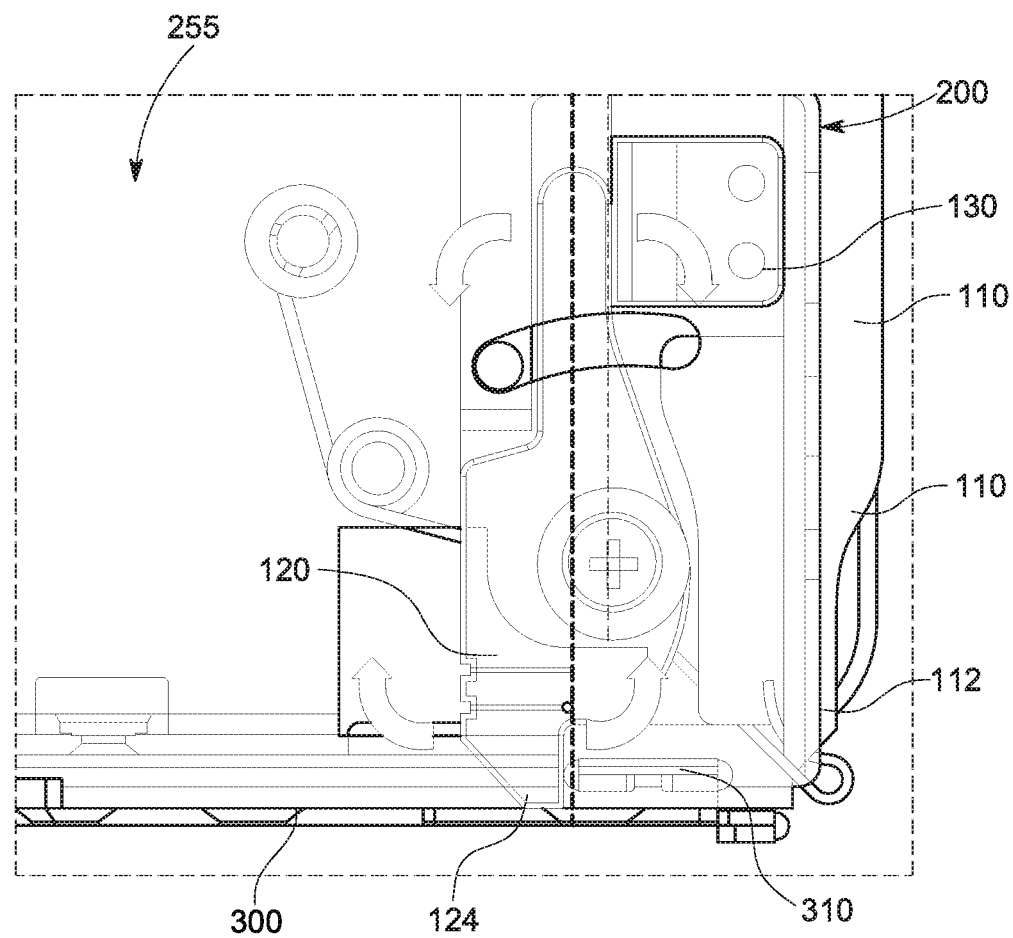
FIG. 6A is a top view of the lever assembly of the computer module of FIG. 2 in normal alignment with a computer chassis, according to some implementations of the present disclosure.

Pressing on the actuation tab 232 of the lever locking feature 230 allows the closure tab 116 of the lever assembly 100 to slide out of the lever receiving slot 234 of the lever locking feature 230. In turn, the lever assembly 100 is free to swing away from the computer module 200 at a first end, while an opposite end remains rotatably coupled to the computer module 200. In some implementations, the release is encouraged by an extension spring or other biasing feature (FIG. 6A). The extension spring forces the lever assembly 100 to swing out. The force provided by the extension spring causes the expulsion tab 112 of the lever assembly 100 to press against the chassis 300, thereby pushing the computer module 200 at least partially out of the chassis 300.

In addition, the pin 114 of the lever assembly 100 moves within the curved channel 220 of the module frame 210. The pin 114 stops rotation of the base lever 110 once the pin 114 reaches an end of the curved channel 220, thus preventing the lever assembly 100 from swinging out too far at the opened position.

FIG. 4 is a top view of a computer chassis (e.g., the chassis 300) comprising two front modules 250 and a rear module (e.g., the computer module 200), according to some implementations of the present disclosure. The front modules 250 can be inserted from a front end of the chassis 300. The computer module 200 can be inserted from a rear end of the chassis 300. For example, the module frame 210 of the computer module 200 is insertable into the chassis 300.

Figure 5:
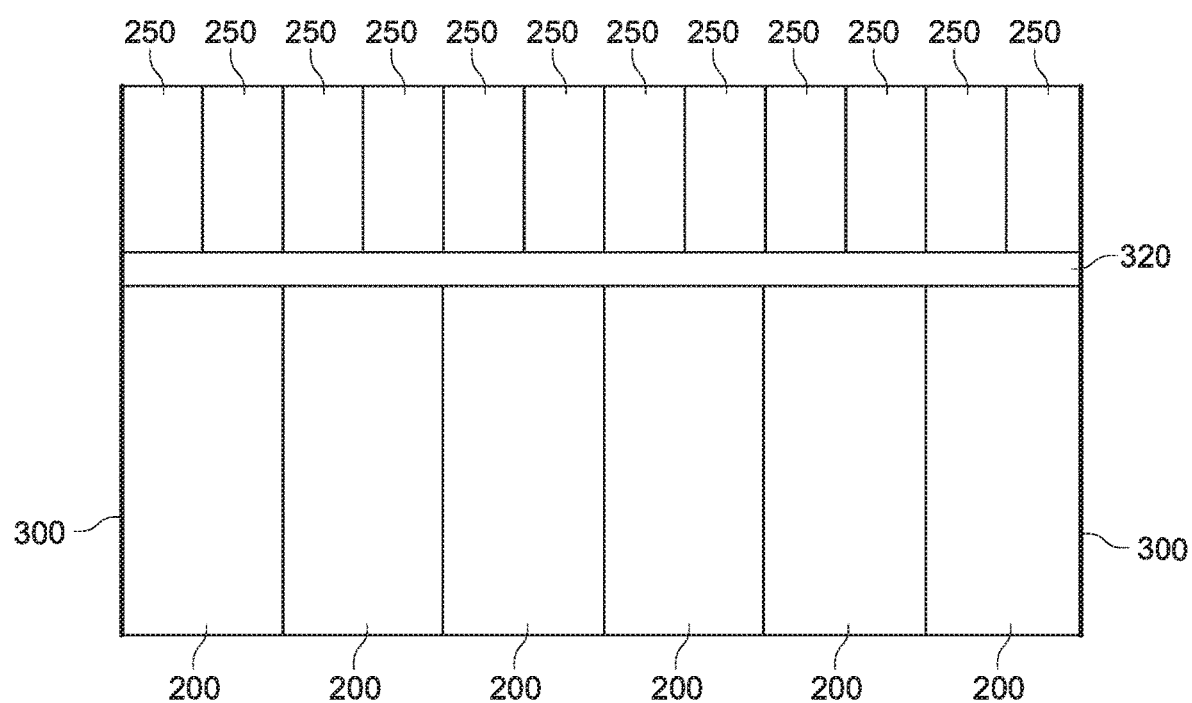
FIG. 5 is a top view of a computer chassis comprising a plurality of front modules and a plurality of rear modules, according to some implementations of the present disclosure.

While FIG. 4 illustrates the computer chassis 300 having two front modules 250 and one rear module 200, additional or fewer modules can be included in the chassis 300. For example, FIG. 5 is a top view of the computer chassis 300 having twelve front modules 250 and six rear modules 200, according to some implementations of the present disclosure. The principles described herein may be employed for the modules of different sized server chassis that allow for insertion of different numbers of modules.

As depicted in FIGS. 4-5, the chassis 300 can include a midplane 320. The midplane 320 can be a physical component (e.g., a plate, a divider, a portion of the front module 250, a portion of the computer module 200, or any combination thereof), an intangible plane, or some combination of both. For example, in some implementations, the midplane is an area that a front module 250 presses against a rear module 200 when both modules are inserted into the chassis 300.

In some implementations, each of the front modules 250 is couplable to the midplane 320 at a first side of the midplane 320. Each of the computer modules 200 is couplable to the midplane 320 at an opposite side of the midplane 320. Insertion of the front module 250 into the chassis 300 may cause some deformation of the midplane 320, which in turn may shift the inserted computer module 200 on the opposite side of the midplane 320 out of alignment.

Figure 6B:
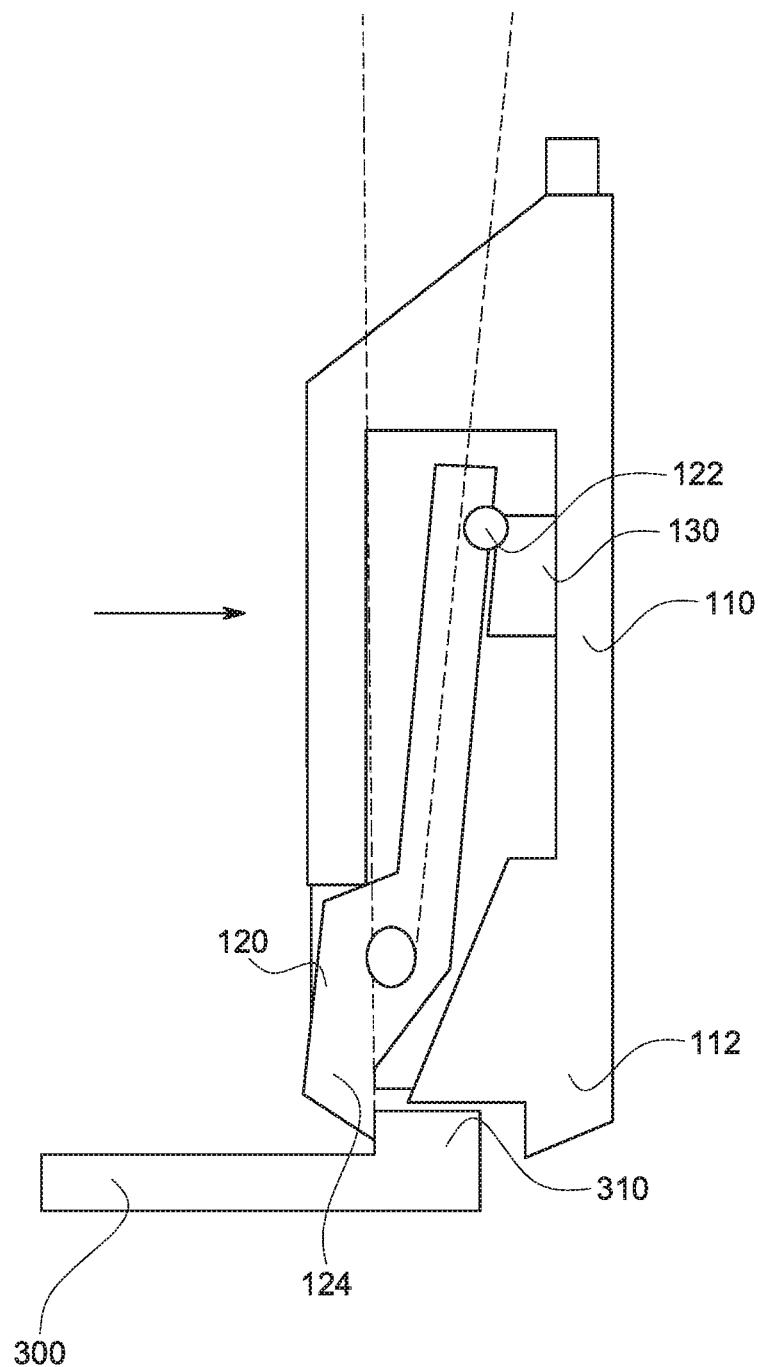
FIG. 6B is a top view of the lever assembly of the computer module of FIG. 2 in compensated alignment with the computer chassis of FIG. 6A, according to some implementations of the present disclosure.

As depicted in FIGS. 6A-6B, the flexible element 130 of the lever assembly 100 flexes to account for deformation in the midplane 320, thereby allowing some compensation of alignment of the locking tab 120 of the lever assembly 100 and the locking surface 310 of the chassis 300. When the computer module 200 is inserted into the chassis 300, and the locking tab 120 of the lever assembly 100 is moved into the locked position, the angled stop tab 124 of the locking tab 120 engages the locking surface 310 of the chassis 300.

FIG. 6A is a top view of the lever assembly 100 coupled to the computer module 200, in normal alignment with the chassis 300. The lever assembly 100 is configured to secure the computer module 200 to the chassis 300 via the locking tab 120 of the lever assembly 100. The locking tab 120 of the lever assembly 100 engages a locking surface 310 on the chassis 300, via the angled stop tab 124 of the locking tab 120, when in a locked position. In some implementations, the locking tab 120 of the lever assembly 100 does not engage the locking surface 310 on the chassis 300 when in the unlocked position, allowing the computer module 200 to be released.

To release the computer module 200 from the chassis 300, the expulsion tab 112 of the lever assembly 100 pushes against the chassis 300 when the base lever 110 of the lever assembly 100 is rotated to an opened position, while the computer module 200 is within the chassis 300. As discussed herein and depicted in FIG. 3, pressing on the actuation tab 232 of the lever locking feature 230 allows the lever assembly 100 to swing away from the computer module 200 to the opened position. In turn, the rotation of the base lever 110 to the opened position induces rotation of the locking tab 120 to the unlocked position, thereby disengaging the lever assembly 100 from the chassis 300.

In some implementations, in normal alignment, the flexible element 130 is not compressed. When there is some deformation in the midplane 320, the base lever 110 moves with the computer module 200. However, the locking tab 120 is rotated by the stop tab 124 contacting the locking surface 310. Thus, the flexible element 130 is compressed by the arm 122 of the locking tab 120, as shown in FIG. 6B.

FIG. 6B is a top view of the lever assembly 100 of the computer module 200 in compensation of alignment with the chassis 300. Rotation of the locking tab 120 compresses the flexible element 130, thereby allowing the angled stop tab 124 at an opposite end of the locking tab 120 to engage the locking surface 310 of the chassis 300. Even though the computer module 200 is shifted away from its aligned position with respect to the chassis 300, the locking tab 120 can remain engaged with the locking surface 310 of the chassis 300.

When there is some deformation in the midplane 320, the computer module 200 is shifted away from its aligned position with respect to the chassis 300. The locking surface 310 of the chassis 300 applies a first force against the angled stop tab 124 of the locking tab 120. The first force is then transferred from the locking tab 120 to the base lever 110 through a base board 255 (FIG. 6A) of the computer module 200. However, the first force is absorbed by the flexible element 130. In other words, the first force is reduced by a second force from compression of the flexible element 130 by the arm 122 of the locking tab 120, thereby substantially retaining the computer module 200 in place with respect to the chassis 300.

While various examples of the present disclosure have been described above, it should be understood that they have been presented by way of example only, and not limitation. Numerous changes to the disclosed examples can be made in accordance with the disclosure herein without departing from the spirit or scope of the disclosure. Thus, the breadth and scope of the present disclosure should not be limited by any of the above described examples. Rather, the scope of the disclosure should be defined in accordance with the following claims and their equivalents.

Although the disclosure has been illustrated and described with respect to one or more implementations, equivalent alterations and modifications will occur to others skilled in the art upon the reading and understanding of this specification and the annexed drawings. In addition, while a particular feature of the disclosure may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A lever assembly for coupling a computer module to a chassis, the lever assembly comprising:
   a base lever rotatably coupled to the computer module, the base lever rotatable between an installed position and an opened position;
   a locking tab seated in a depression of the base lever and rotatably coupled to the computer module for engaging a locking surface on the chassis when in a locked position, the locking tab rotatable between the locked position and an unlocked position; and
   a flexible element seated in the depression of the base lever and positioned adjacent to an arm of the locking tab to bias the locking tab into the locked position when the base lever is in the installed position, wherein the arm of the locking tab is configured to compress an elastic portion of the flexible element such that the flexible element is configured to bias the locking tab via the arm of the locking tab, and wherein rotation of the base lever to the opened position induces rotation of the locking tab to the unlocked position.

2. The lever assembly of claim 1, wherein the base lever and the locking tab are rotatable about a same axis of rotation.

3. The lever assembly of claim 1, wherein the base lever comprises an expulsion tab such that rotation of the base lever to the opened position while the computer module is within the chassis causes the expulsion tab to press against an adjacent portion of the chassis, thereby causing the computer module to be at least partially removed from the chassis.

4. The lever assembly of claim 1, wherein:
   the flexible element is configured to bias the base lever to the opened position; the locking tab is coupled to the computer module and engageable with the computer module to retain the base lever in the installed position; and
   the locking tab is actuatable to release the base lever and permit the flexible element to rotate the base lever into the opened position.

5. The lever assembly of claim 1, wherein the base lever further comprises a pin extending from one side of an upper surface of the base lever and in proximity to the arm of the locking; tab, wherein the pin is moveable between two ends of a channel on the computer module, wherein the pin stops rotation of the base lever at the opened position.

6. The lever assembly of claim 1,
   wherein the chassis is a computer server chassis comprising a midplane;
   wherein the midplane is couplable to a front module on a first side of the midplane, and is couplable to a rear module on a second side of the midplane opposite the first side of the midplane;
   wherein the computer module is the rear module couplable to the midplane, when (i) the rear module is inserted into the chassis, and (ii) the locking tab is moved into the locked position; and
   wherein the flexible element flexes to account for deformation in the midplane.

7. The lever assembly of claim 1, wherein the flexible element comprises a spring coupled to the base lever such that the spring is configured to cause an expulsion tab of the lever assembly to press against the chassis, thereby pushing the computing module at least partially out of the chassis.

8. A computer module for insertion within a chassis, the computer module comprising:
   a module frame insertable into the chassis; and
   a lever assembly coupled to the module frame, the lever assembly comprising:
      a base lever rotatably coupled to the module frame, the base lever rotatable between an installed position and an opened position;
      a locking tab seated in a depression of the base lever and rotatably coupled to the module frame for engaging a locking surface on the chassis when in a locked position, the locking tab rotatable between the locked position and an unlocked position; and a flexible element seated in the depression of the base lever and positioned adjacent to an arm of the locking tab to bias the locking tab into the locked position when the base lever is in the installed position, wherein the arm of the locking tab is configured to compress an elastic portion of the flexible element such that the flexible element is configured to bias the locking tab via the arm of the locking tab, and wherein rotation of the base lever to the opened position induces rotation of the locking tab to the unlocked position.

9. The computer module of claim 8, wherein the base lever and the locking tab are rotatable about a same axis of rotation.

10. The computer module of claim 8, wherein the base lever comprises an expulsion tab such that rotation of the base lever to the opened position while the computer module is within the chassis causes the expulsion tab to press against an adjacent portion of the chassis, thereby causing the computer module to be at least partially removed from the chassis.

11. The computer module of claim 8, wherein:
the flexible element is configured to bias the base lever to the opened position; the locking tab is coupled to the module frame and engageable with the computer module to retain the base lever in the installed position; and
the locking tab is actuatable to release the base lever and permit the flexible element to rotate the base lever into the opened position.

12. The computer module of claim 8, wherein the base lever further comprises a pin extending from one side of an upper surface of the base lever and in proximity to the arm of the locking tab, wherein the pin is moveable between two ends of a channel on the module frame, wherein the pin stops rotation of the base lever at the opened position.

13. The computer module of claim 8,
wherein the chassis is a computer server chassis comprising a midplane;
wherein the midplane is couplable to a front module on a first side of the midplane, and is couplable to a rear module on a second side of the midplane opposite the first side of the midplane;
wherein the computing module is the rear module couplable to the midplane, when (i) the rear module is inserted into the chassis, and (ii) the locking tab is moved into the locked position; and
wherein the flexible element flexes to account for deformation in the midplane.

14. The computer module of claim 8, wherein the flexible element comprises a spring coupled to the base lever such that the spring is configured to cause an expulsion tab of the lever assembly to press against the chassis, thereby pushing the computing module at least partially out of the chassis.

15. A method, comprising:
inserting a computer module into a chassis, wherein the computer module comprises a lever assembly for securing the computer module into the chassis;
securing the computer module in the chassis in an installed position by engaging a locking tab of the lever assembly against a locking surface of the chassis, the locking tab seated in a depression of a base lever of the lever assembly and rotatable coupled to the computer module for engaging the locking surface;
accommodating deformation of a midplane by compressing a flexible element coupled to the base lever, the flexible element seated in the depression of the base lever and positioned adjacent to the locking tab; and
releasing the computer module, wherein the releasing the computer module comprises rotating the base lever to an opened position to induce rotation of the locking tab to an unlocked position.

16. The method of claim 15, wherein the base lever and the locking tab are rotatable about a same axis of rotation.

17. The method of claim 15, wherein the base lever comprises an expulsion tab, and wherein releasing the computer module further comprises applying force to the chassis using the expulsion tab in response to rotating the base lever to the opened position.

18. The method of claim 15, wherein:
the flexible element is configured to bias the base lever to the opened position; and
the locking tab is coupled to the computer module and engageable with the computer module to retain the base lever in an installed position: and releasing the computer module further comprises actuating the locking tab to release the base lever and permit the flexible element to rotate the base lever into the opened position.

19. The method of claim 15, wherein the base lever further comprises a pin extending from one side of an upper surface of the base lever and in proximity to an arm of the locking tab, wherein the pin is moveable between two ends of a channel on the computer module, wherein the pin stops rotation of the base lever at the opened position.

20. The method of claim 15, wherein the flexible element comprises a spring coupled to the base lever such that the spring is configured to cause an expulsion tab of the lever assembly to press against the chassis, thereby pushing the computing module at least partially out of the chassis.

* * * * *